(12) United States Patent
Barends et al.

(10) Patent No.: US 9,709,600 B2
(45) Date of Patent: Jul. 18, 2017

(54) CIRCUIT PROBE FOR CHARGED PARTICLE BEAM SYSTEM

(71) Applicant: FEI Company, Hillsboro, OR (US)

(72) Inventors: Paul Johannes L. Barends, Oisterwijk (NL); Mathijs P. W. van den Boogaard, Boxtel (NL); Philip Brundage, Portland, OR (US)

(73) Assignee: FEI Company, Hillsboro, OR (US)

( * ) Notice: Subject to any disclaimer, the term of this patent is extended or adjusted under 35 U.S.C. 154(b) by 205 days.

(21) Appl. No.: 14/460,161

(22) Filed: Aug. 14, 2014

(65) Prior Publication Data

US 2015/0048815 A1 Feb. 19, 2015

Related U.S. Application Data

(60) Provisional application No. 61/866,003, filed on Aug. 14, 2013.

(51) Int. Cl.
*G01R 1/067* (2006.01)
*H01J 37/20* (2006.01)

(52) U.S. Cl.
CPC .......... *G01R 1/06705* (2013.01); *H01J 37/20* (2013.01); *H01J 2237/206* (2013.01);
(Continued)

(58) Field of Classification Search
CPC ........ G01Q 60/00; G01Q 70/00; G01Q 70/16; G01Q 60/24; G01Q 60/38; G01Q 80/00; G01R 1/067; G01R 1/06705; G11B 11/26; G11B 9/14; G05B 2219/37119; G05B 2219/37127; H01J 37/20; H01J 2237/208; H01J 2237/24564; H01J 2237/206; H01J 2237/2008
See application file for complete search history.

(56) References Cited

U.S. PATENT DOCUMENTS 3,939,414 A   2/1976   Roch
4,480,223 A   10/1984  Aigo
(Continued)

FOREIGN PATENT DOCUMENTS

JP   H09326425   1/1997
JP   H0926436    12/1997
(Continued)

OTHER PUBLICATIONS

McAuley, C.N., et al., "3D Failure Analysis in Depth Profiles of Sequentially Made FIB Cuts", Microelectronics and Reliability, 2007, pp. 1595-1598, vol. 47.

*Primary Examiner* — Son Le
(74) *Attorney, Agent, or Firm* — Scheinberg & Associates, P.C.; Michael O. Scheinberg

(57) ABSTRACT

A probe assembly can be connected and disconnected from its electrical harness within a vacuum chamber so that the probe assembly with the work piece mounted can be rotated and tilted without interference from a cable, and can then be reconnected without opening the vacuum chamber. Also described is a means of grounding a sample and probes when the probe assembly is disconnected from its electrical harness and a means of preventing damage to the probe mechanism and the probe itself by ensuring that the probes are not sticking up too far during operations.

10 Claims, 15 Drawing Sheets

(52) U.S. Cl.
CPC . *H01J 2237/208* (2013.01); *H01J 2237/2008* (2013.01); *H01J 2237/24564* (2013.01); *H01J 2237/24592* (2013.01)

(56) References Cited

U.S. PATENT DOCUMENTS

| | | | |
|---|---|---|---|
| 4,623,839 A | 11/1986 | Garretson et al. | |
| 4,633,176 A | 12/1986 | Reimer | |
| 4,777,716 A | 10/1988 | Folk et al. | |
| 4,827,127 A | 5/1989 | Todokoro | |
| 4,875,005 A | 10/1989 | Terada et al. | |
| 4,893,914 A | 1/1990 | Hancock et al. | |
| 5,729,150 A | 3/1998 | Schwindt | |
| 6,031,383 A | 2/2000 | Streib et al. | |
| 6,060,892 A * | 5/2000 | Yamagata | G01R 31/2887 324/754.07 |
| 6,137,302 A | 10/2000 | Schwindt | |
| 6,191,598 B1 | 2/2001 | Hollman | |
| 6,198,299 B1 | 3/2001 | Hollman | |
| 6,380,751 B2 | 4/2002 | Harwood et al. | |
| 6,424,141 B1 | 7/2002 | Hollman et al. | |
| 6,541,989 B1 | 4/2003 | Norris et al. | |
| 6,605,955 B1 | 8/2003 | Costello et al. | |
| 6,621,282 B2 | 9/2003 | Hollman | |
| 6,636,059 B2 | 10/2003 | Harwood et al. | |
| 6,649,919 B2 | 11/2003 | Chao et al. | |
| 6,683,320 B2 | 1/2004 | Gerlach et al. | |
| 6,700,397 B2 | 3/2004 | Hollman et al. | |
| 6,744,268 B2 | 6/2004 | Hollman | |
| 6,801,047 B2 | 10/2004 | Harwood et al. | |
| 6,803,756 B2 | 10/2004 | Hollman et al. | |
| 6,838,895 B2 | 1/2005 | Hollman | |
| 6,873,176 B1 | 3/2005 | Yeh et al. | |
| 6,891,170 B1 | 5/2005 | Yu et al. | |
| 6,909,273 B1 | 6/2005 | Lau | |
| 6,917,195 B2 | 7/2005 | Hollman | |
| 6,960,765 B2 | 11/2005 | Tomimatsu et al. | |
| 6,967,335 B1 | 11/2005 | Dyer et al. | |
| 6,973,406 B2 | 12/2005 | Zemer et al. | |
| 6,995,579 B2 | 2/2006 | Schwindt | |
| 7,009,383 B2 | 3/2006 | Harwood et al. | |
| 7,023,225 B2 | 4/2006 | Blackwood | |
| 7,061,256 B2 | 6/2006 | Hasegawa | |
| 7,071,713 B2 | 7/2006 | Furukawa et al. | |
| 7,071,718 B2 | 7/2006 | Schwindt | |
| 7,106,049 B2 | 9/2006 | Lau | |
| 7,180,317 B2 | 2/2007 | Hollman | |
| 7,220,973 B2 | 5/2007 | Yu et al. | |
| 7,221,177 B2 | 5/2007 | Komatsu et al. | |
| 7,248,067 B2 | 7/2007 | Poechmueller | |
| 7,250,779 B2 | 7/2007 | Dunklee et al. | |
| 7,253,646 B2 | 8/2007 | Lou et al. | |
| 7,262,613 B2 | 8/2007 | Komatsu et al. | |
| 7,285,778 B2 | 10/2007 | Baur et al. | |
| 7,295,023 B2 | 11/2007 | Lou et al. | |
| 7,297,945 B2 | 11/2007 | Hazaki et al. | |
| 7,301,146 B2 | 11/2007 | Tomimatsu et al. | |
| 7,304,486 B2 | 12/2007 | Petersen et al. | |
| 7,348,787 B2 | 3/2008 | Harwood et al. | |
| 7,372,283 B2 | 5/2008 | Furukawa et al. | |
| 7,535,247 B2 | 5/2009 | Andrews et al. | |
| 7,553,334 B2 | 6/2009 | Hazaki et al. | |
| 7,576,553 B2 | 8/2009 | Lou et al. | |
| 7,579,854 B2 | 8/2009 | Kiesewetter et al. | |
| 7,595,632 B2 | 9/2009 | Harwood et al. | |
| 7,598,755 B2 | 10/2009 | Furukawa et al. | |
| 7,616,018 B2 | 11/2009 | Lou et al. | |
| 7,626,406 B2 | 12/2009 | Ishii | |
| 7,659,742 B1 | 2/2010 | Jacobson et al. | |
| 7,675,300 B2 | 3/2010 | Baur et al. | |
| 7,683,645 B2 | 3/2010 | Ku et al. | |
| 7,688,088 B2 | 3/2010 | Komatsu et al. | |
| 7,764,079 B1 | 7/2010 | Daoudi et al. | |
| 7,795,860 B2 | 9/2010 | Sullivan | |
| 7,847,575 B2 | 12/2010 | Potok et al. | |
| 7,888,655 B2 | 2/2011 | van Gaasbeek et al. | |
| 7,898,281 B2 | 3/2011 | Andrews et al. | |
| 7,918,669 B1 | 4/2011 | Tiengtum | |
| 8,074,293 B2 | 12/2011 | Hazaki et al. | |
| 8,159,245 B2 | 4/2012 | Komatsu et al. | |
| 8,816,712 B2 | 8/2014 | Nakamura et al. | |
| 2003/0042921 A1 * | 3/2003 | Hollman | G01R 1/07392 324/750.14 |
| 2003/0098702 A1 | 5/2003 | Tatematsu et al. | |
| 2003/0184332 A1 | 10/2003 | Tomimatsu et al. | |
| 2004/0119492 A1 | 6/2004 | Schneidewind et al. | |
| 2004/0189336 A1 | 9/2004 | Fink | |
| 2005/0140379 A1 | 6/2005 | Furukawa et al. | |
| 2005/0269511 A1 | 12/2005 | Tomimatsu et al. | |
| 2006/0114012 A1 | 6/2006 | Reitinger | |
| 2006/0145716 A1 | 7/2006 | Komatsu et al. | |
| 2007/0063725 A1 | 3/2007 | Komatsu et al. | |
| 2007/0290703 A1 | 12/2007 | Hollman | |
| 2008/0218185 A1 | 9/2008 | Furukawa et al. | |
| 2012/0161804 A1 | 6/2012 | Root et al. | |
| 2013/0099134 A1 | 4/2013 | Sun et al. | |
| 2015/0378267 A1 | 12/2015 | Shibazaki | |

FOREIGN PATENT DOCUMENTS

| | | |
|---|---|---|
| JP | 2000147070 A | 5/2000 |
| JP | 2002181898 A | 6/2002 |
| JP | 2003309153 A | 10/2003 |
| JP | 2005210067 A | 8/2005 |
| JP | 2005251745 A | 9/2005 |
| JP | 2009224788 A | 10/2009 |
| KR | 20110137389 | 12/2011 |

* cited by examiner

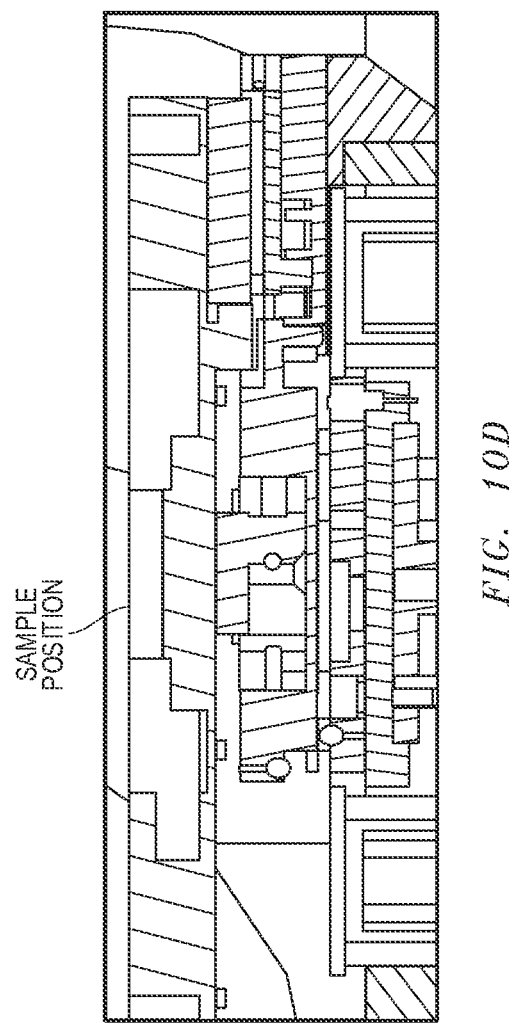

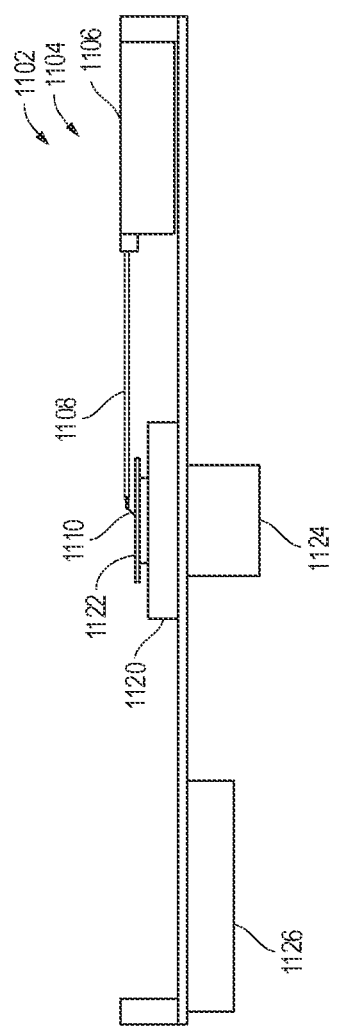

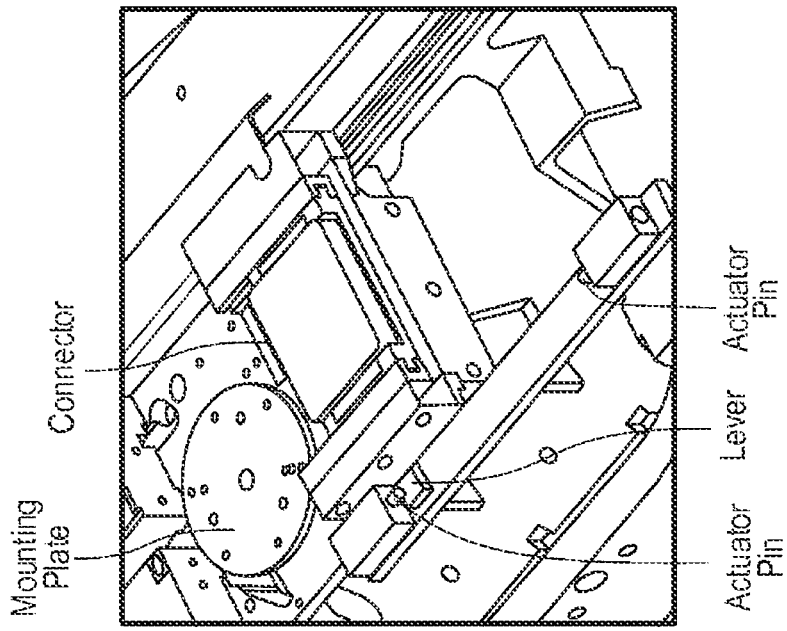
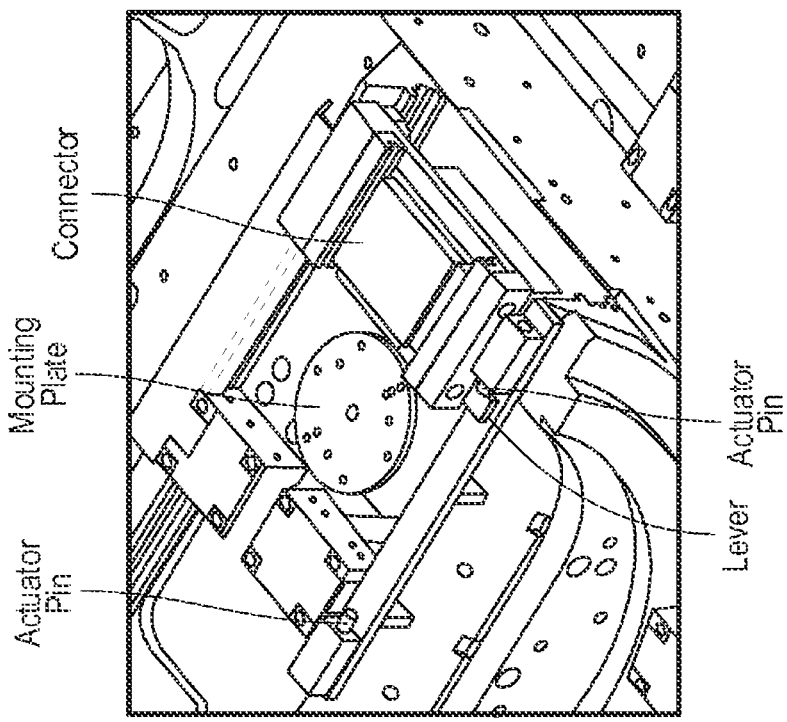

CIRCUIT PROBE FOR CHARGED PARTICLE BEAM SYSTEM

CROSS-REFERENCE TO RELATED APPLICATIONS

This application claims priority from U.S. Provisional Application 61/866,003 filed Aug. 14, 2013, which is hereby incorporated by reference.

TECHNICAL FIELD OF THE INVENTION

The present invention relates to electrical probes for use with charged particle beams systems.

BACKGROUND OF THE INVENTION

Using small conductors on the nanometer scale to probe electrical circuits is referred to as nanoprobing. Nanoprobing is widely used in the semiconductor market for failure analyses and device characterization. Some probes can be positioned with a resolution of better than 10 nm to measure or apply a voltage or current to electrically test a circuit.

Before probing, the sample needs to be prepared, for example, by exposing buried conductors to electrically access a circuit. A dual beam system, that is, a charged particle beam system including an ion beam column and an electron beam column, is a powerful tool for sample analysis. In a dual beam system, the ion beam can be used, for example, to expose buried layers of a circuit, and the electron beam can be used to form a highly magnified image of the exposed layers of the circuit. An advantage of some dual beam systems is that the stage can tilt and rotate to expose the work piece to the electron beam and ion beam from different angles for milling different structures and for imaging. Another advantage of some system is that a voltage can be applied to a portion of the stage to reduce the energy of the beam after the beam passes the final focusing lens and before the beam impacts the circuit, thereby reducing sample damage while maintaining high resolution.

Nanoprobe assemblies for positioning within an electron microscope are available for example from Kleindiek Nanotechnik GmbH, Reutlingen, Germany. A probe assembly can have any number of electrical probes, sometime, 4, 6, or 8, that can apply or sense a voltage from a circuit under test. Each probe includes a manipulator that can raise or lower the probe tip to contact the circuit. The probe tip is typically electrically isolated from the manipulator. When a probe assembly is mounted in the dual beam system, however, much of the flexibility of the dual beam is lost. The cabling to the probe assembly restricts the stage movement so it can be impossible to rotate and tilt the sample in a manner required for charged particle beam processing. The electronics of the probe assembly may prevent the application of a retarding voltage to the stage or sample, so that the electron beam energy cannot be reduced after passing the focusing lens.

Because the presence of the probe assembly in the dual beam system reduces the flexibility of the system, prevents rotation and beam deceleration, it is necessary to remove the work piece from the system having the probe assembly and insert it into another dual beam system to process the work piece. The work piece can then be moved back into the first system that includes the probe assembly.

SUMMARY OF THE INVENTION

An object of the invention is to provide the flexibility of a dual beam system in combination with a probe assembly.

Some embodiments of the invention provide a mechanism to connect and disconnect a probe assembly from its electrical harness within a vacuum chamber so that the probe assembly with the work piece mounted can be rotated and tilted without interference from a cable, and can then be reconnected without opening the vacuum chamber. Some embodiments of the invention provide a means of grounding a sample and probes when the probe assembly is disconnected from its electrical harness. Some embodiments of the invention provide a means of preventing damage to the probe mechanism and the probe itself by ensuring that the probes are not sticking up too far during operations, such as passing through an air lock or tiling the stage, in which the probes are positioned near an object that could damage them.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 2A shows probes configured to probe the sample, and FIG. 2B shows the sample moved to contact the ground post for charged particle beam processing.

FIG. 3A shows a neutral configuration in which the sample is not in contact with the grounded post or with the probe. In FIG. 3B, the sample is moved to contact the horizontal element of the grounded post.

FIG. 4A shows the probe and sample in a neutral position with neither the probe, the sample, the grounded post, nor the probe grounding conductor contacting one another. FIG. 4B shows a configuration for processing the sample with the charged particle beam, with the sample in contact with the grounded post and the probe in contact with the probe-grounding conductor. FIG. 4C shows a configuration for probing the sample, with the probe contacting the sample and not the probe-grounding conductor, and the sample not contacting the grounded post. FIG. 4D shows a top view of a probe assembly, showing a sample contacting the grounded pole and the probe grounding conductor above the multiple probes.

FIGS. 10A to 10D show the steps of loading the probe assembly from a load lock, connecting it to an electrical connector, and moving it into a position to observe for charged particle beam observation.

FIG. 11 shows a schematic of a probe assembly.

FIGS. 12A and 12B shows the connector assembly positioned to connect and disconnect, respectively, the connector from the socket on the probe assembly.

DETAILED DESCRIPTION OF PREFERRED EMBODIMENTS

It is desirable to be able to switch back and forth between electrically testing a sample using a nanoprobe and processing the sample using charged particle beam processing without removing the sample from the vacuum chamber.

During processing, applicants have recognized that, in some sample preparation processes, it is desirable that:
 a. The sample region of interest is at the coincident point of the beams;
 b. The sample is grounded;
 c. The needles are grounded;
 d. The sample can tilt to 52 degrees; and
 e. While at 42 degrees tilt, the stage can rotate fully through +/−180 degrees.

The wiring harness that carries electrical signals to and from the probe assembly must be disconnected before tilting or rotating, and disconnecting will eliminate the ground connection from the sample and the needles. Also, the wiring harness must be disconnected before biasing the stage to a high voltage, which reducing the beam energy, to avoid damaging the probe electronics and creating unsafe conditions.

FIG. 11 shows an embodiment of a probe assembly 1102. The probe assembly typically has multiple probes, such as six or eight probes, although only one probe 1104 is shown. Probe 1104 includes a manipulator 1106 that can move in the horizontal plane and that can raise and lower an arm 1108 that supports a probe tip 1110. A probe sample stage 1120 that can move the sample in three dimensions, that is, in an x-y plane and vertically, supports a sample 1122. A stub 1124 mounts into a stage of a microscope and a socket 1126 provides electrical connections for the probes and the sample stage.

Figure 1:
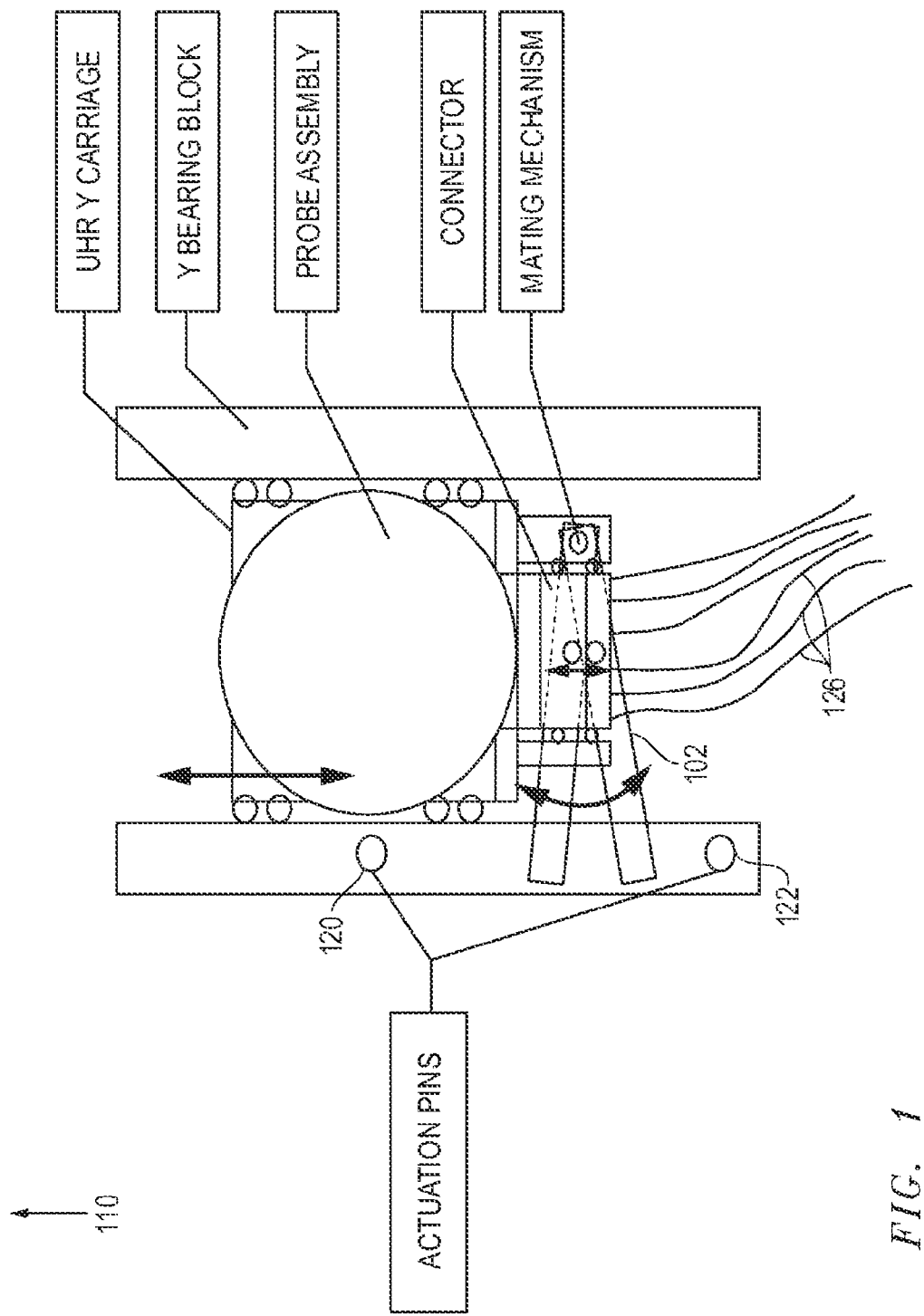
FIG. 1 shows schematically a probe assembly on a carriage of a high resolution stage.

FIG. 1 shows a probe assembly that can connect and disconnect the electrical harness from the probe assembly by moving the stage within the vacuum chamber. Applicants found the drive mechanism of the precision stage provided insufficient force to simply push a wiring harness electrical connector onto and off of the probe assembly electrical connector. FIG. 1 shows a probe assembly that uses a lever 102 to increase the force from the stage movement to connect or disconnect a wiring harness electrical connector from a probe assembly electrical connector.

The probe assembly is preferably positioned on a five-axis stage, that is, the stage can move in the X, Y, and Z direction and can tilt and rotate. Only the Y-axis movement mechanism is shown in FIG. 1. The probe assembly is shown positioned on an ultra high resolution (UHR) Y carriage that moves within a Y bearing block. A connector mating assembly having a lever 102 is attached to a separable portion of the probe assembly. When the UHR Y carriage moves in the direction of arrow 110, the lever contacts actuator pin 120, and the lever is displace in the direction opposite to arrow 110, pulling the connector out of the probe assembly connector. While this embodiment uses a lever, any mechanism, such as a cam, cables, or whatever, can be used. A robot or motor driven mechanism can be used. After the connectors are disconnected, the probe assembly is then free to travel to the extent provided by the stage. The probe assembly can tilt and rotate with the stage without a wiring harness 126 restricting its motion. Also, the stage can be electrically biased by known methods to reduce beam energy without the risk of the high biasing voltage being transmitted through the cable.

After the sample is processed, for example, by milling on a focused ion beam or imaging using the electron beam, the UHR Y carriage is moved in the direct opposite arrow 110, the lever 102 contacts actuator pin 122, which forces the connector back into the connector on the probe assembly so that the sample can be probed. This process can be repeated, for example, as different layers are removed from the sample using the ion beam, and exposed layers are electrically probed in sequence. Embodiments of the invention allow the electrical connections to the probe assembly to be connected and disconnected within the vacuum chamber, without venting the vacuum chamber to the atmosphere.

Figure 5:
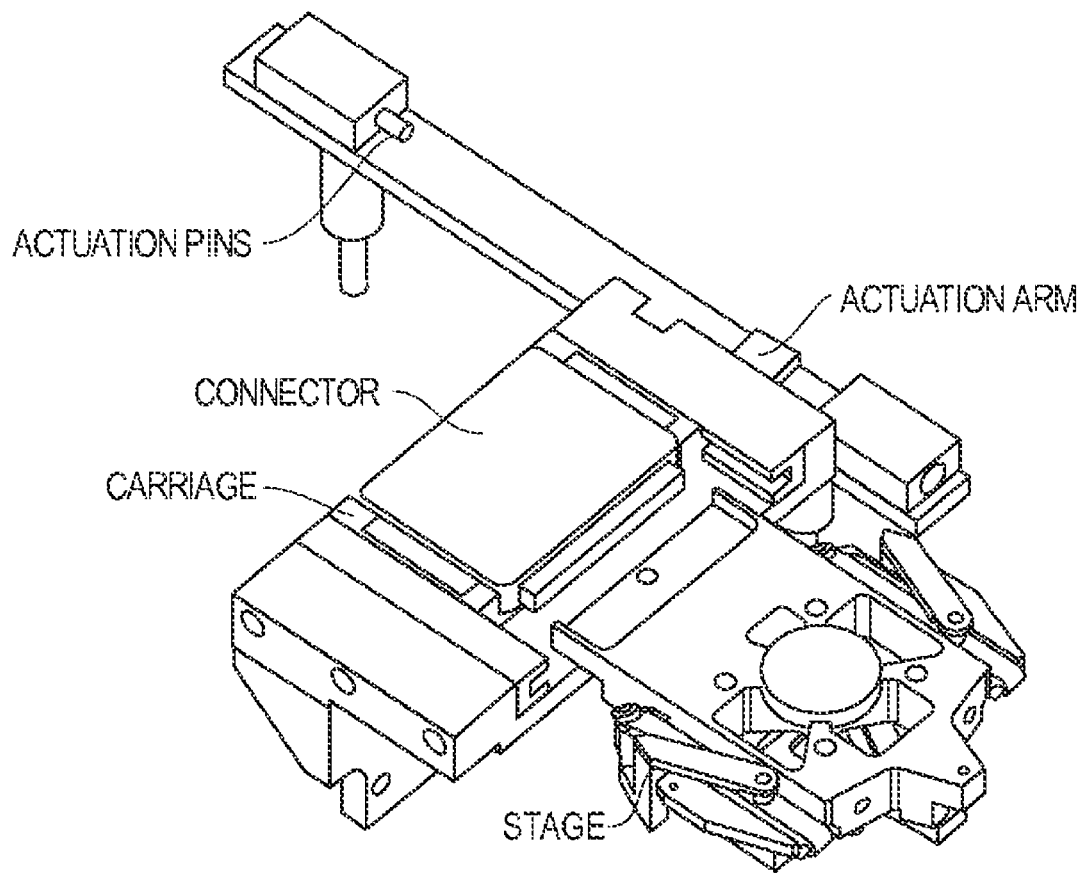
FIG. 5 shows in more detail the electrical connect and disconnect mechanism of FIG. 1.
Figure 8:
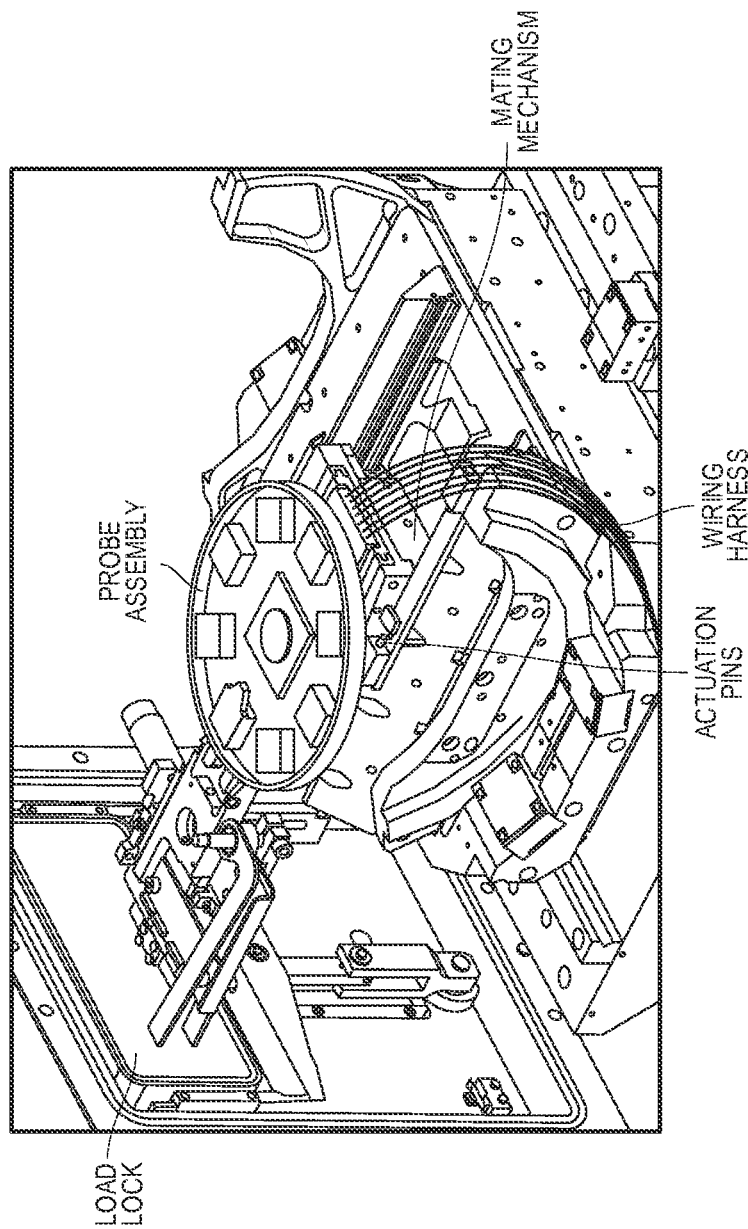
FIG. 8 shows a probe assembly being inserted from a load lock and being mounted onto a stage in a vacuum chamber

FIG. 5 shows a connection mechanism for selectively connecting and disconnecting a probe assembly. The probe assembly mounts on the stage as shown in in FIG. 8. When the stage is moved, connector mechanism is actuated moved. When the actuator arm (lever) presses against the actuator pins on ends of its travel, the connector connects or disconnects from the connector. FIG. 8 shows a wiring harness connected to the connector of the mating mechanism. The wiring harness typically extends to a port to conduct signals between the inside and outside of the vacuum chamber.

FIGS. 12A and 12B show the connector assembly on the stage in different positions to connect or disconnect the connector to the probe assembly, which is not shown but which would be mounted above the round plate shown. FIG. 12A shows the connector assembly position in which the lever would force the connector into the socket on the probe assembly. FIG. 12B shows the connector assembly position in which the lever would force the connector out of the socket on the probe assembly, causing it to disconnect.

As shown in FIG. 11, each probe includes a manipulator portion and a conductive probe portion. The conductive probe portion is electrically insulated form the manipulator portion and from the base of the probe assembly, which is grounded through the stage. The sample holder in the probe assembly is electrically insulated from the base of the probe assembly. Electrical contact to the conductive probe portion and the sample is made through the wiring harness of the probe assembly.

Figure 2A:
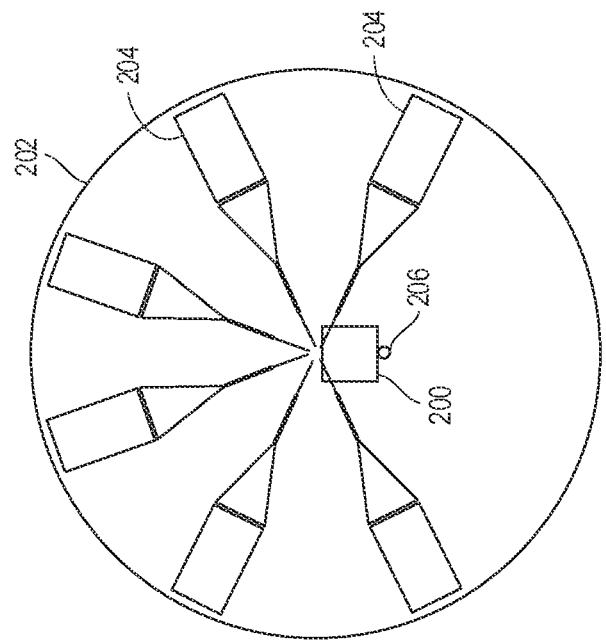
FIGS. 2A and 2B show a probe assembly, a sample and a conductive post in different configurations.
Figure 2B:
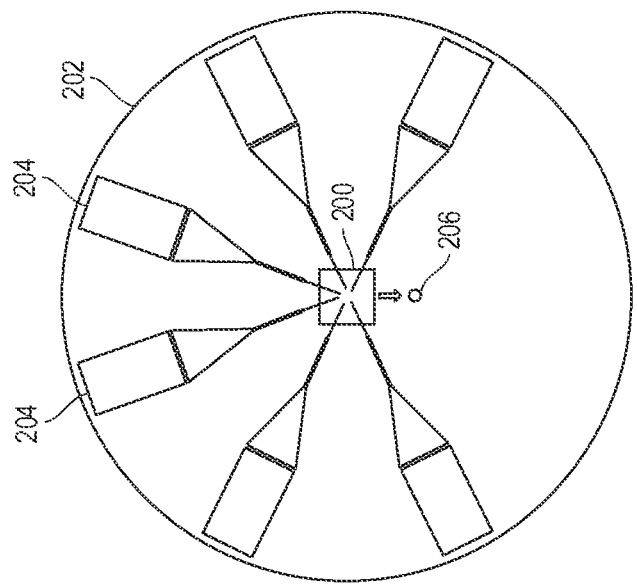

When the wiring harness is disconnected from the probe assembly, the sample and the probes are electrically floating, that is, they are not grounded. When the charged particle beam is directed at the sample, the sample becomes charged if it is not grounded. FIGS. 2A and 2B show one method of grounding the sample. Probe assembly 202 includes six probes 204 for testing sample 200. Probes can be used to apply a signal to the sample or to measure a signal on the sample. A post 206 extends from the base of the probe assembly. When the sample is not being electrically probed but is being processed by a charged particle beam, the sample is moved to electrically contact post 206. Post 206 is grounded through the base of the probe assembly, which is grounded through the system stage. The operator can push the substage on the probe assembly against the grounding element before loading the probe assembly into the vacuum chamber. Alternatively, the probe assembly can be mated with connector to power the substage, which is then driven using the motors until it contacts the grounding element. In some embodiments, a manipulator can be sued to move the substage against the ground element. The probes are now away from the point at which the charged particle beam will impact the sample, and the sample is now grounded.

Figure 3A:
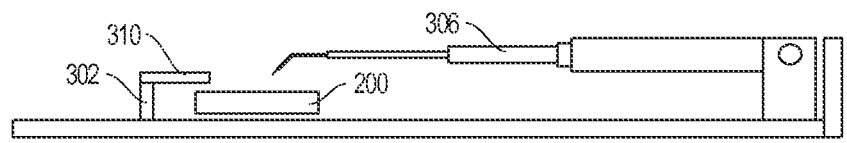
FIGS. 3A and 3B show, in different configurations, a probe, a sample and a grounded post having a horizontal element.
Figure 3B:
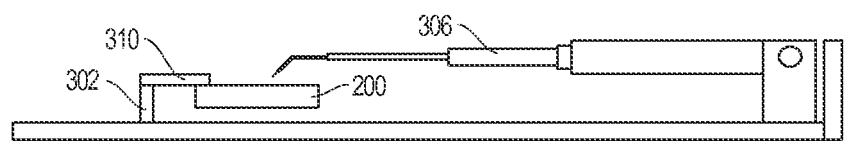

FIGS. 3A and 3B show another embodiment for grounding the sample 200. Rather than moving the sample in the horizontal plane to contact post 200 as in FIGS. 2A and 2B, the sample is moved vertically to contact a post 302 having a horizontal portion 310. As with moving the sample horizontally, the sample substage can be manually moved against the ground post before being inserted in to the vacuum chamber; the sample substage can be powered and moved against the ground post, or a manipulator external to the probe assembly can move the substage.

The embodiments of FIGS. 2A, 2B, 3A and 3B provide a way to ground the sample, but the probes themselves are not grounded. FIGS. 4A-4D show the use of a grounded element above the probes, a "mezzanine," that will ground the probes when the probe actuators raise the probes to contact the mezzanine. The mezzanine when used in combination with the grounded post of any of FIGS. 2A, 2B, 3A, or 3B can provide a ground contact for the probes and for the sample when the wiring harness is disconnected from the probe assembly. The mezzanine is grounded through the base of the probe assembly and through the system stage.

Figure 4A:
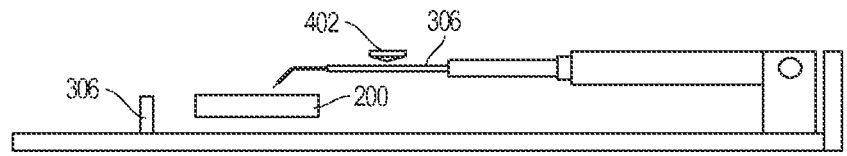
FIGS. 4A, 4B, 4C, and 4D show, in various configurations, a probe, a sample a grounded post, and a probe-grounding conductor.
Figure 4B:
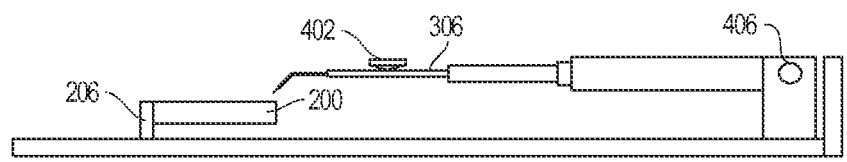
Figure 4C:
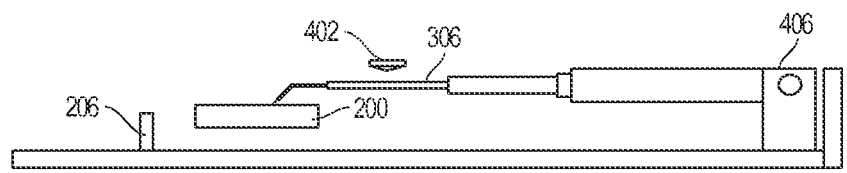
Figure 4D:
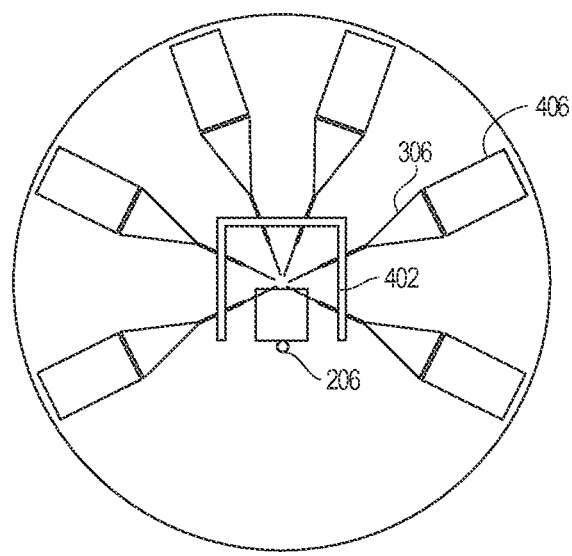

FIG. 4A shows a configuration when neither the sample 200 nor the probes 306 are grounded. In FIG. 4B, the sample has been moved to contact ground pole 206, and the probe 306 has been raised by manipulator 406 to contact grounded mezzanine 402. The probes can also be moved manually to contact the mezzanine before being placed in the vacuum chamber, or a manipulator can be used to position the probes. In the configuration shown, both the probe and the sample are grounded. The sample can therefore be operated on by the charged particle beam, and no static charge will accumulate on the sample or needle. In the configuration shown in FIG. 4C, the sample is being probed. Neither the sample nor the needles are grounded. The Y carriage has been moved so that the connector for the probe assembly has been reconnected to the probe assembly, and the probe is lowered to contact the sample for electrical testing. FIG. 4D shows the probe assembly with post 206 and mezzanine 402 in the grounded configuration.

Figure 6:
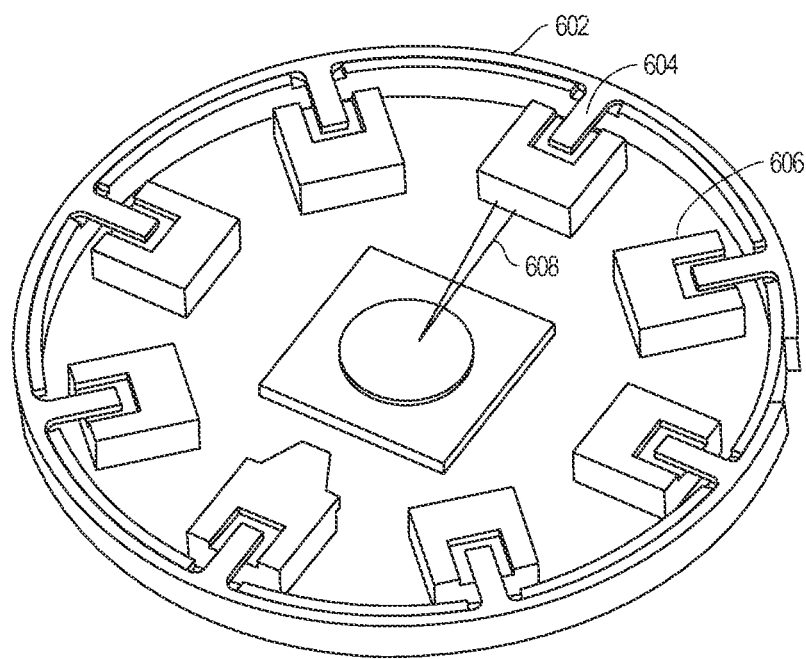
FIG. 6 shows a height constructor that limits the elevation angle of probe mechanism to prevent damage to the probe and probe mechanism, for example, when moved in and out of the vacuum chamber or when the stage is tilted.
Figure 7:
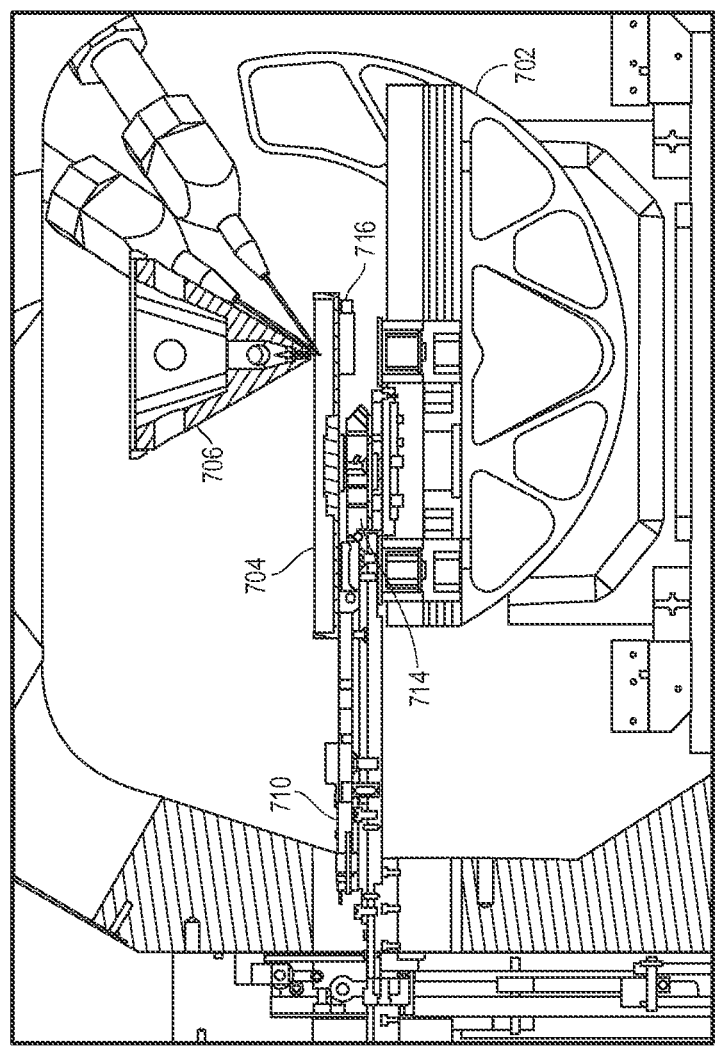
FIG. 7 shows a probe assembly in the vacuum chamber of a charged particle beam system.
Figure 9:
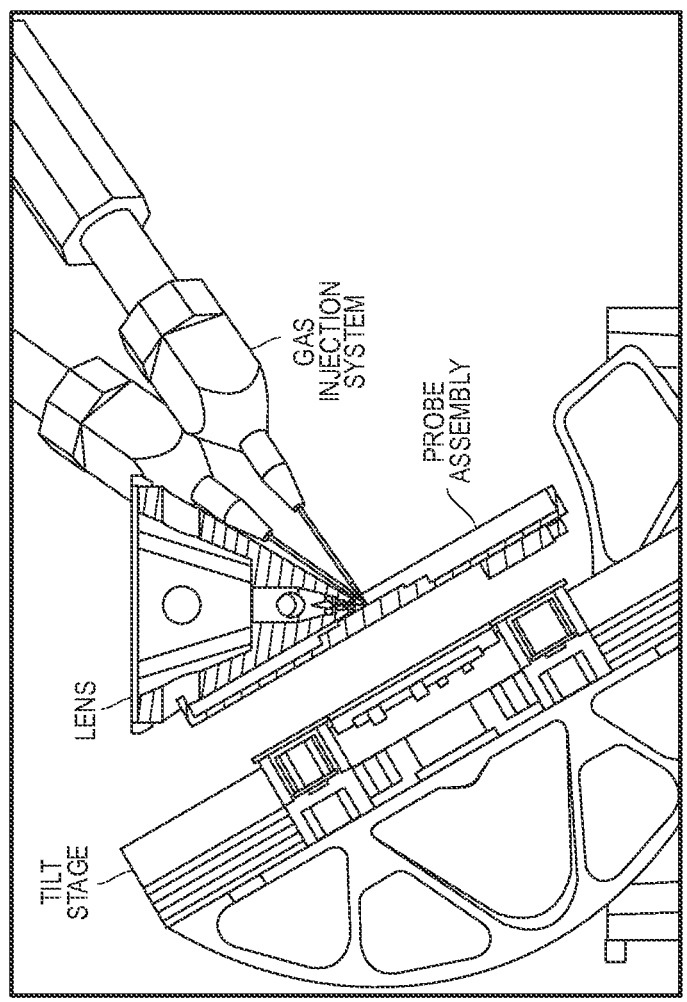
FIG. 9 shows a probe assembly on a tilted stage and shows the position of the probe assembly relative to the lens.

The mezzanine is used not only to ground the probes, but it can also be used to prevent the probe from elevated to a point where it would be damages when the probe is tilted upward during physical motion, for example, while the probe assembly is being inserted into an airlock of a vacuum system or when the probe assembly with the sample is being tilted for charged particle beam processing. FIG. 6 shows another structure for preventing damage to the probe assembly by keeping the probes from elevating excessively. The structure includes a ring 602 having tabs 604 that extend from the ring and prevent the manipulator 608 portion of the probe and therefore the conductive portion 608 of the probe, from extending too far above the probe assembly base plate, which could damage the probe when it is close to another structure, such as when the probe assembly is passing through a lock and into a vacuum chamber, or when the stage is tilted, bringing the probe assembly near the focusing lens of a charged particle beam column. In some embodiments, tabs 604 are positioned so that the range of motion of the manipulators 608 allows them to be moved out from under the tabs for easy replacement of individual probes. FIG. 9 shows the inside of a vacuum chamber with the sample stage tilted. FIG. 7 shows that the probe assembly is very close to the lens when the stage is tilted. It is necessary that the probes to not extend significantly above the sample probe holder, or the probes will hit the lens and be damaged.

FIG. 7 shows the inside of a vacuum chamber. A tilt stage 702 supports a translation stage 714 that supports a probe assembly 704 having a socket 716. The probe assembly is brought into the vacuum chamber on a load lock shuttle 710 through the load lock. FIG. 7 shows a lens 706 for focusing charged particles onto the sample positioned on the probe assembly.

Figure 10A:
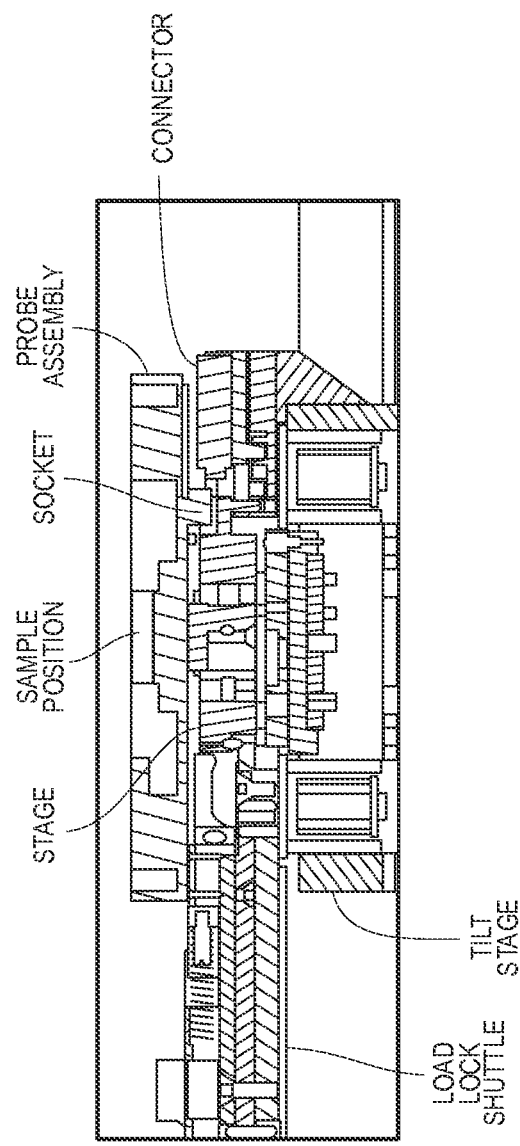
Figure 10B:
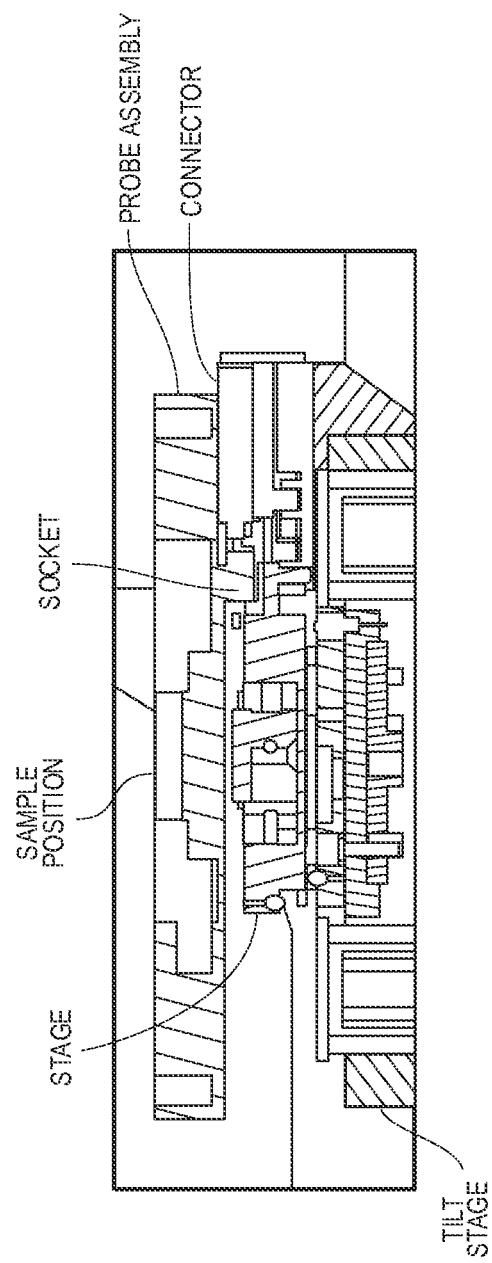
Figure 10C:
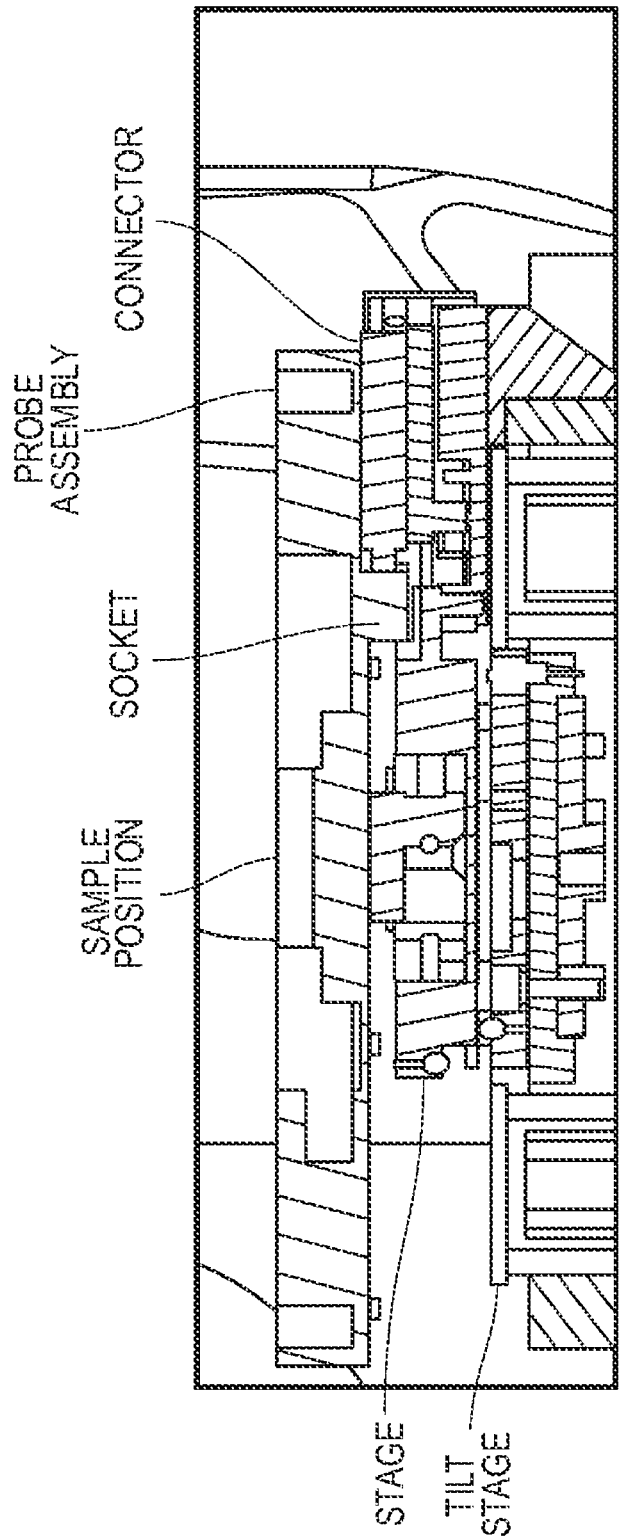

FIGS. 10A to 10B shows the steps of loading a probe assembly onto a stage. The probe assembly is brought into the vacuum chamber on a load lock shuttle and place on the stage mount as shown in FIG. 10A. The stage assembly is lowered by the shuttle into the position shown in FIG. 10B. FIG. 100 shows that the stage is moved horizontally to mate the connector on the connector assembly to the socket on the probe assembly as described above. In FIG. 10D, the stage with the probe assembly electrically connected is raised so that the sample is positioned at the eucentric, that is, at the point where the beams are coincident point and will stay coincident during rotation or tilt of the stage.

One aspect of the invention provides a system for electrical probing of a work piece in a vacuum chamber, comprising:

a vacuum chamber;

a movable and rotatable stage;

a probe assembly adapted to be supported on the rotatable stage, the probe assembly including:

one or more electrical probes for contacting the work piece and providing or sensing electrical signal; and an electrical connector for providing or receiving electrical signals to or from the probe;

the electrical connector configured so that motion of the stage can selectively connect or disconnect the electrical connector to allow the stage to move freely when the electrical connector is disconnected.

In some embodiments, the system further comprises one or more first elements mounted on a first portion of the stage and one or more second elements mounted on the a second portion of the stage that is moveable with respect to the first portion, one of the first element contacting the one of the second elements to physically disconnect or reconnect the electrical connector.

In some embodiments, the one or more of the first elements comprises an actuator pin and one or more of the second elements comprise a lever that is moved by the actuator pins.

In some embodiments, the system further comprises a conductor for grounding the sample when the electrical connector is disconnected.

In some embodiments, the conductor is a post that is contacted by the sample by moving the stage.

In some embodiments, the system further comprises a conductor for grounding the probe needles when the electrical connector is disconnected.

In some embodiments, the system further comprises a mechanical barrier external to the probes that limits the extension of the probes.

Some aspects of the invention include a method of operating a charged particle beam system, comprising:

inserting a probe assembly through a load lock of a vacuum chamber, the probe assembly including:

multiple probes; and a sample position for supporting a sample during probing by the multiple probes;

processing the sample in the vacuum chamber using a charged particle beam;

without opening the vacuum chamber, mating a first electrical connector on the probe assembly with a second electrical connector in the vacuum chamber; and contacting one or more of the multiple probes to the sample to perform electrical testing on the sample.

In some embodiments, the method further comprises after processing the sample using the charged particle beam and contacting one or more of the multiple probes to the sample to perform electrical testing on the sample:

disconnecting the first electrical connector and the second electrical connector;

processing the sample a second time using the charged particle beam;

mating the first electrical connector with the second electrical connector a second time; and contacting one or more of the multiple probes to the sample to perform electrical testing on the sample a second time.

In some embodiments, the method further comprises before processing the sample the first time or the second time using focused ion beam, grounding the sample.

In some embodiments, the method further comprises during processing of the sample the first time or the second time using the charged particle beam, electrically biasing the sample to reduce the energy of the charged particles impinging on the sample while the probe assembly connector is not connected.

In some embodiments, the method further comprises grounding the probes while processing the sample in the vacuum chamber using the charged particle beam.

In some embodiments, grounding the sample comprises moving the sample horizontally or vertically into contact with a grounding conductor.

In some embodiments, the method further comprises providing a physical restraint, external to the probes themselves, on the maximum elevation of the probe to prevent damage to the probe.

In some embodiments, the invention includes a method and apparatus for grounding a sample in a probe assembly mounted in a vacuum chamber, the method comprising moving the sample or sample stage horizontally or vertically to contact a ground post.

In some embodiments, the invention includes a method and apparatus for grounding a probe in a probe assembly mounted in a vacuum chamber, the method comprising moving the probe to contact a grounded conductor above or below the probe.

In some embodiments, the invention includes a method and apparatus for protecting a probe in a probe assembly mounted in a vacuum chamber, the method comprising providing an external restriction that restricts motion of the probe to prevent the probe from extending far enough above the probe assembly to collide with an airlock or lens or other structure.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. For example, the method and apparatus for grounding the sample is thought to be patentable distinct from the method and apparatus for electrically connecting and disconnecting the probe assembly. Also, the method and apparatus for grounding the probes and the method and apparatus for protecting the probes by limiting their range of motion and separately patentable. These inventions can be used independently and are not required to be used together. The invention has broad applicability and can provide many benefits as described and shown in the examples above. The embodiments will vary greatly depending upon the specific application, and not every embodiment will provide all of the benefits and meet all of the objectives that are achievable by the invention.

Although much of the previous description is directed at mineral samples from drill cuttings, the invention could be used to prepare samples of any suitable material. The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the following discussion and in the claims, the terms "including" and "comprising" are used in an open-ended fashion, and thus should be interpreted to mean "including, but not limited to . . . " To the extent that any term is not specially defined in this specification, the intent is that the term is to be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A system for electrical probing of a work piece in a vacuum chamber, comprising:

a vacuum chamber;

a movable and rotatable stage;

a probe assembly adapted to be supported on the rotatable stage, the probe assembly including:

one or more electrical probes for contacting the work piece and providing or sensing electrical signal; and an electrical connector for providing or receiving electrical signals to or from the probe;

the electrical connector configured so that motion of the stage can selectively connect or disconnect the electrical connector to allow the stage to move freely when the electrical connector is disconnected;

one or more first elements mounted on a first portion of the stage and one or more second elements mounted on a second portion of the stage that is moveable with respect to the first portion, one of the first elements contacting the one of the second elements to physically disconnect or reconnect the electrical connector.

2. The system of claim 1 in which the one or more of the first elements comprises an actuator pin and one or more of the second elements comprise a lever that is moved by the actuator pins.

3. The system of claim 1 further comprising a conductor for grounding the work piece when the electrical connector is disconnected.

4. The system of claim 3 in which the conductor is a post that is contacted by the work piece by moving the stage.

5. The system of claim 1 further comprising a conductor for grounding the probe needles when the electrical connector is disconnected.

6. The system of claim 1 further comprising a mechanical barrier external to the probes that limits the extension of the probes.

7. A method of operating a charged particle beam system, comprising:
   inserting a probe assembly through a load lock of a vacuum chamber, the probe assembly including:
   multiple probes; and
   a sample position for supporting a sample during probing by the multiple probes;
   processing the sample in the vacuum chamber using a charged particle beam;
   without opening the vacuum chamber, mating a first electrical connector on the probe assembly with a second electrical connector in the vacuum chamber, the mating being achieved by using a motorized motion system otherwise used for positioning the sample in the particle beam system; and
   contacting one or more of the multiple probes to the sample to perform electrical testing on the sample;
   after processing the sample using the charged particle beam and contacting one or more of the multiple probes to the sample to perform electrical testing on the sample:
   disconnecting the first electrical connector and the second electrical connector;
   processing the sample a second time using the charged particle beam;
   mating the first electrical connector with the second electrical connector a second time; and
   contacting one or more of the multiple probes to the sample to perform electrical testing on the sample a second time.

8. The method of claim 7 further comprising before processing the sample the first time or the second time using focused ion beam, grounding the sample.

9. The method of claim 7 further comprising, during processing of the sample the first time or the second time using the charged particle beam, electrically biasing the sample to reduce the energy of the charged particles impinging on the sample while the probe assembly connector is not connected.

10. The method of claim 8 in which grounding the sample comprises moving the sample horizontally or vertically into contact with a grounding conductor.

* * * * *